United States Patent
Dede

(10) Patent No.: US 8,305,755 B2
(45) Date of Patent: Nov. 6, 2012

(54) POWER MODULES, COOLING DEVICES AND METHODS THEREOF

(75) Inventor: Ercan Mehmet Dede, Ann Arbor, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 237 days.

(21) Appl. No.: 12/717,595

(22) Filed: Mar. 4, 2010

(65) Prior Publication Data

US 2011/0216502 A1  Sep. 8, 2011

(51) Int. Cl.
H05K 7/20 (2006.01)
F28F 7/00 (2006.01)

(52) U.S. Cl. .................. 361/691; 361/689; 165/185

(58) Field of Classification Search .......... 361/689, 361/691; 165/185
See application file for complete search history.

(56) References Cited

U.S. PATENT DOCUMENTS

| | | | |
|---|---|---|---|
| 4,108,242 A * | 8/1978 | Searight et al. ............... 165/164 |
| 4,277,816 A * | 7/1981 | Dunn et al. ................... 361/694 |
| 4,750,086 A | 6/1988 | Mittal |
| 5,016,090 A * | 5/1991 | Galyon et al. ................. 257/714 |
| 5,025,856 A * | 6/1991 | VanDyke et al. ............. 165/167 |
| 5,329,994 A * | 7/1994 | Collings et al. ............. 165/109.1 |
| 5,365,400 A * | 11/1994 | Ashiwake et al. ............. 361/752 |
| 5,586,866 A * | 12/1996 | Wettstein ..................... 416/96 A |
| 5,864,466 A * | 1/1999 | Remsburg ..................... 361/700 |
| 6,000,908 A * | 12/1999 | Bunker .......................... 416/95 |
| 6,122,917 A * | 9/2000 | Senior ............................ 60/752 |
| 6,237,344 B1 * | 5/2001 | Lee ................................ 60/754 |
| 6,431,260 B1 | 8/2002 | Agonafer et al. |
| 6,941,250 B1 | 9/2005 | Nishiwaki et al. |
| 6,988,534 B2 | 1/2006 | Kenny et al. |
| 7,255,153 B2 | 8/2007 | Berger et al. |
| 7,362,574 B2 | 4/2008 | Campbell et al. |
| 7,450,378 B2 | 11/2008 | Nelson et al. |
| 2002/0062945 A1 * | 5/2002 | Hocker et al. .................. 165/53 |
| 2003/0131980 A1 * | 7/2003 | DeMarche et al. ........... 165/169 |
| 2005/0280994 A1 * | 12/2005 | Yazawa ......................... 361/699 |
| 2007/0028960 A1 * | 2/2007 | Royne et al. .................. 136/259 |
| 2007/0119565 A1 | 5/2007 | Brunschwiler et al. |
| 2007/0153474 A1 | 7/2007 | Andersen et al. |
| 2009/0032937 A1 | 2/2009 | Mann et al. |
| 2009/0050294 A1 | 2/2009 | Fedorov |
| 2009/0090490 A1 | 4/2009 | Yoshida et al. |
| 2009/0145581 A1 * | 6/2009 | Hoffman et al. ............. 165/80.3 |

OTHER PUBLICATIONS

L.H. Olesen, F. Okkels, and H. Bruus, "A high-level programming-language implementation of topology optimization applied to steady-state Navier-Stokes flow," International Journal for Numerical Methods in Engineering, vol. 65, No. 7, 2006.

B. Lemke, Z. Liu, and J.G. Korvink, "Implementation of structural topology optimization in COMSOL," COMSOL Users Conference, Frankfurt, Germany, 2006.

* cited by examiner

*Primary Examiner* — Anatoly Vortman
(74) *Attorney, Agent, or Firm* — Dinsmore & Shohl LLP

(57) ABSTRACT

A jet impingement cooling device may include a jet structure and a target layer. The jet structure may include at least one fluid jet operable to produce an impingement jet of cooling fluid. The target layer may further include a heat receiving surface configured to be coupled to a heat generating device and a jet impingement target surface. The jet impingement target surface may further include at least one target structure having a wavy-fin topology with a fin peak, wherein the fluid jet and the target structure are arranged such that the fin peak of the target structure is aligned with a centerline of the impingement jet of cooling fluid during operation of the jet impingement cooling device.

20 Claims, 10 Drawing Sheets

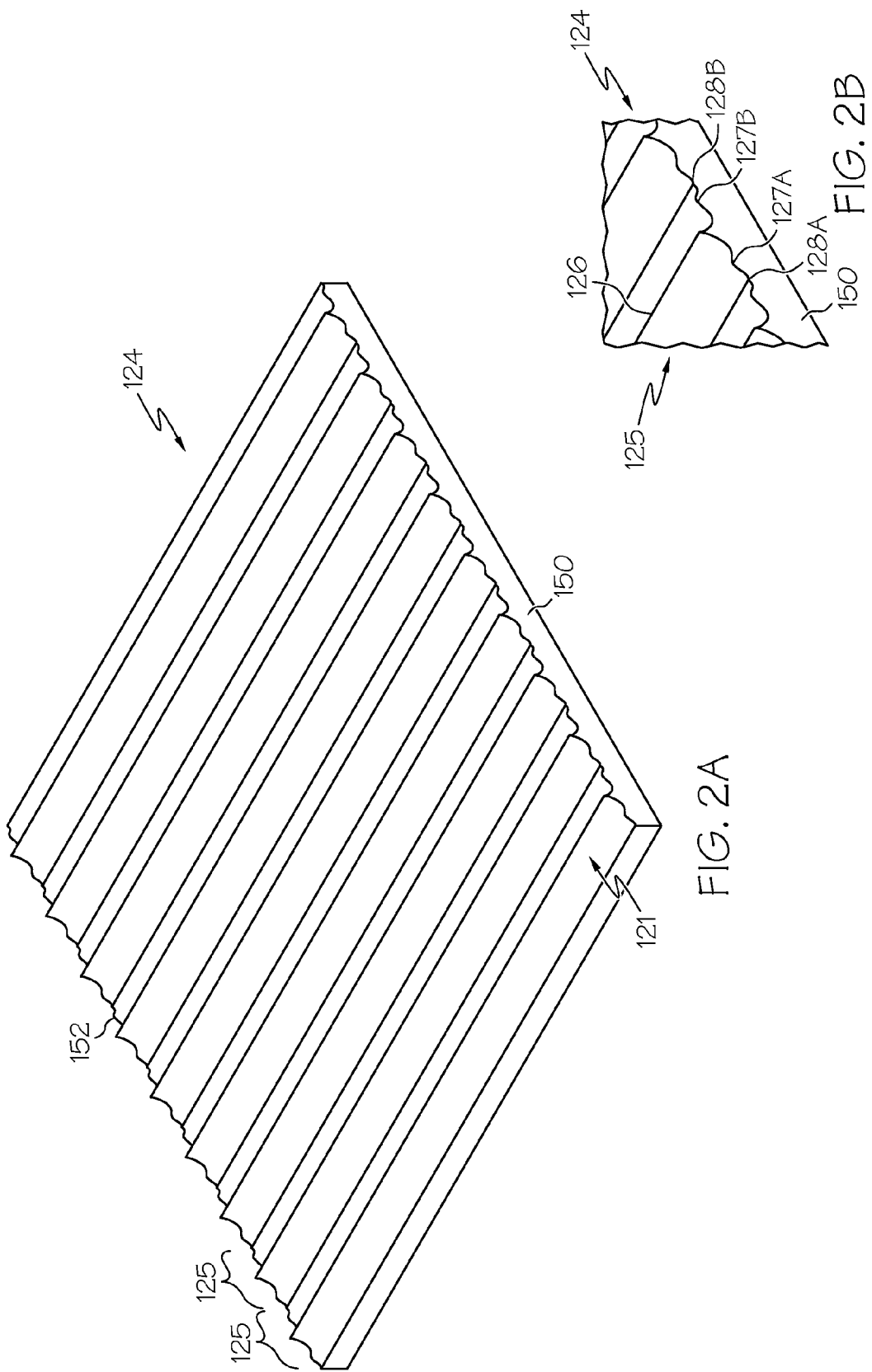

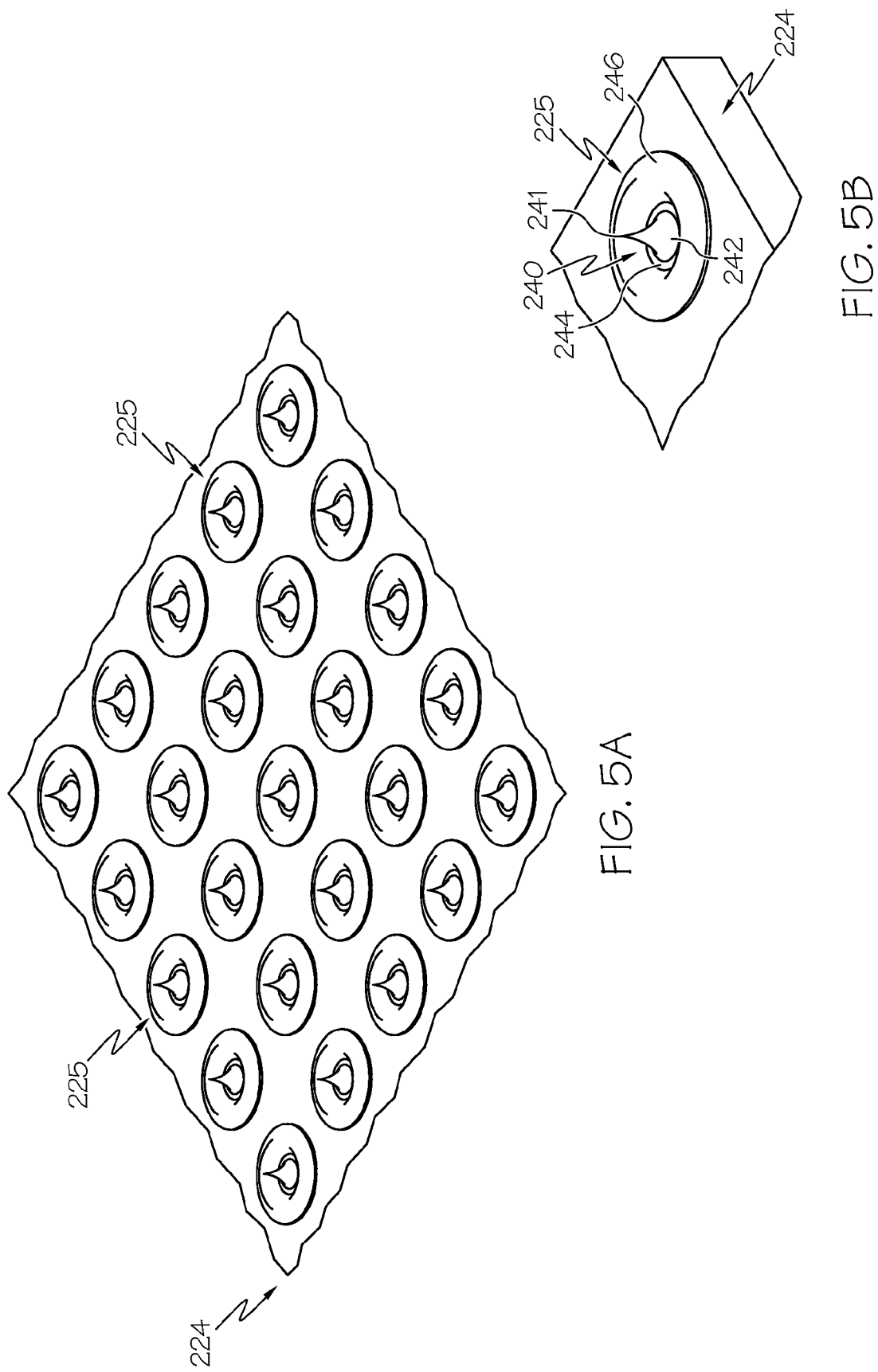

POWER MODULES, COOLING DEVICES AND METHODS THEREOF

TECHNICAL FIELD

The present specification generally relates to apparatuses and methods for cooling devices and, more specifically, power modules, jet impingement cooling devices and methods for cooling heat generating devices.

BACKGROUND

A jet impingement heat sink may be coupled to a heat generating device such as a semiconductor device, for example, to remove heat and lower the maximum operating temperature of the heat generating device. Conventional jet impingement heat sinks utilize a relatively flat target surface of which jets of cooling fluid impinge to transfer heat from the heat generating device and target surface to the cooling fluid, which is then removed from the jet impingement heat sink. However, conventional flat target surfaces at the impingement region may not effectively lower the maximum operating temperature at a desired pressure drop, and may also not provide an even temperature profile across the target surface.

Accordingly, a need exists for alternative jet impingement cooling devices for cooling heat generating devices.

SUMMARY

In one embodiment, a jet impingement cooling device may include a jet structure and a target layer. The jet structure may include at least one fluid jet operable to produce an impingement jet of cooling fluid. The target layer may further include a heat receiving surface configured to be coupled to a heat generating device, and a jet impingement target surface. The jet impingement target surface may further include at least one target structure having a wavy-fin topology with a fin peak, wherein the fluid jet and the target structure are arranged such that the fin peak of the target structure is aligned with a centerline of the impingement jet of cooling fluid during operation of the jet impingement cooling device.

In another embodiment, a power module may include a semiconductor module and a jet impingement cooling device. The jet impingement cooling device includes a jet structure, a target layer and a cooling fluid reservoir positioned between the jet structure and the target layer. The jet structure may include at least one fluid jet operable to produce an impingement jet of cooling fluid. The target layer may include a heat receiving surface coupled to a first surface of the semiconductor module and a jet impingement target surface. The jet impingement target surface may include at least one target structure further including a wavy-fin topology having a fin peak. The fluid jet and the target structure are arranged such that the fin peak of the target structure is aligned with a centerline of the impingement jet of cooling fluid during operation of the jet impingement cooling device. The cooling fluid reservoir is operable to receive cooling fluid from the fluid jet and includes an outlet operable to provide a cooling fluid exit flow.

In yet another embodiment, a method of cooling a semiconductor device may include providing a target layer including a heat receiving surface coupled to the heat generating device, and a jet impingement target surface. The jet impingement target surface may include an array of target structures, each target structure including a wavy-fin topology having a fin peak. The method may further include providing an array of fluid jets and directing impingement jets of cooling fluid from the array of fluid jets toward the array of target structures such that each impingement jet of cooling fluid directly impinges the fin peak of each target structure. Heat generated by the heat generating device may be transferred to the cooling fluid to create a substantially uniform temperature distribution across the jet impingement target surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 2A depicts a schematic illustration of a target surface of a jet impingement cooling device according to one or more embodiments shown and described herein;

FIG. 2B depicts a schematic illustration of a target structure of a target surface according to one or more embodiments shown and described herein;

FIG. 5A depicts a schematic illustration of a target surface of a jet impingement cooling device according to one or more embodiments shown and described herein;

FIG. 5B depicts a schematic illustration of a target structure of a target surface according to one or more embodiments shown and described herein.

DETAILED DESCRIPTION

Figure 1A:
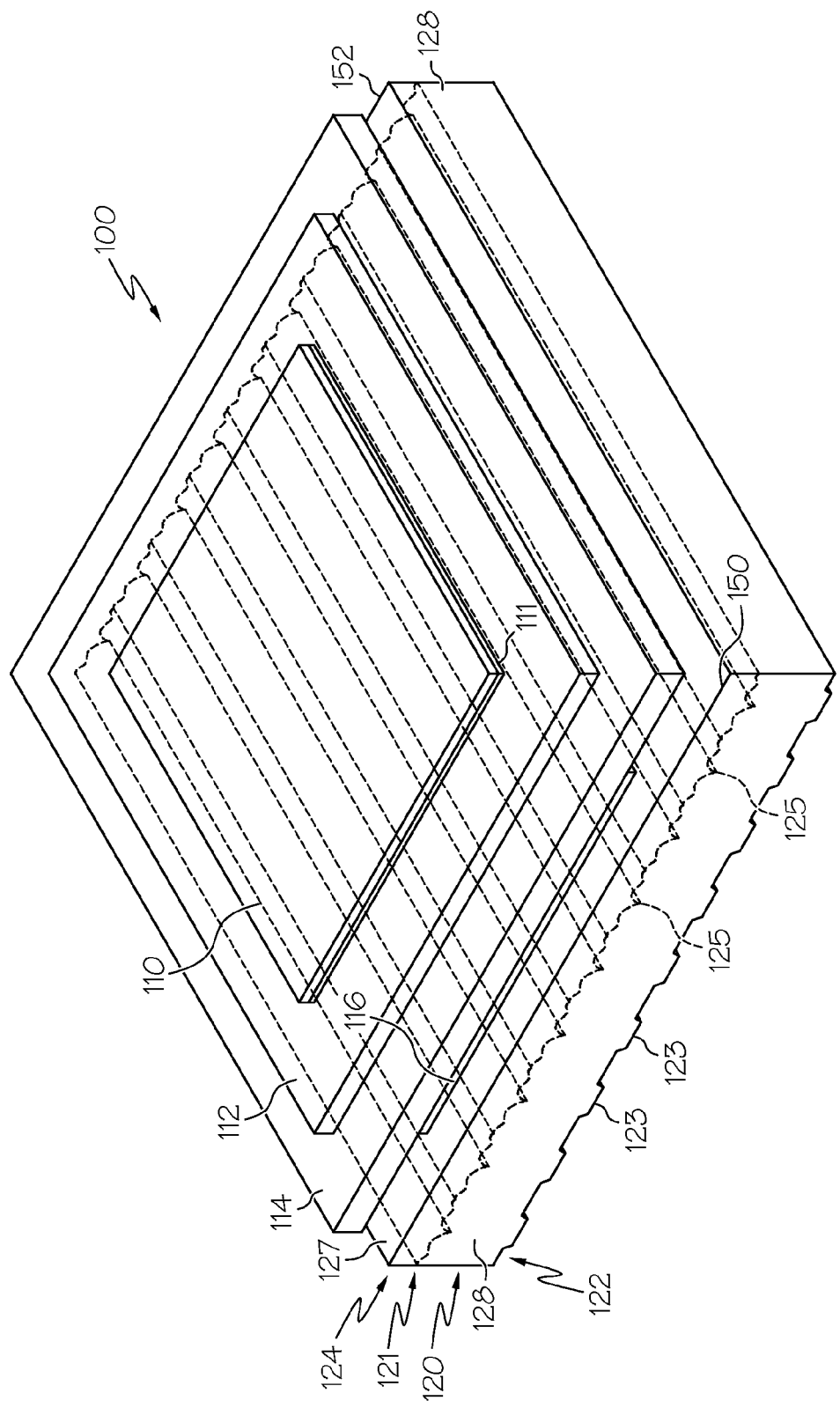
FIGS. 1A-1C depict a schematic illustration of a power module comprising a jet impingement cooling device according to one or more embodiments shown and described herein.
Figure 1B:
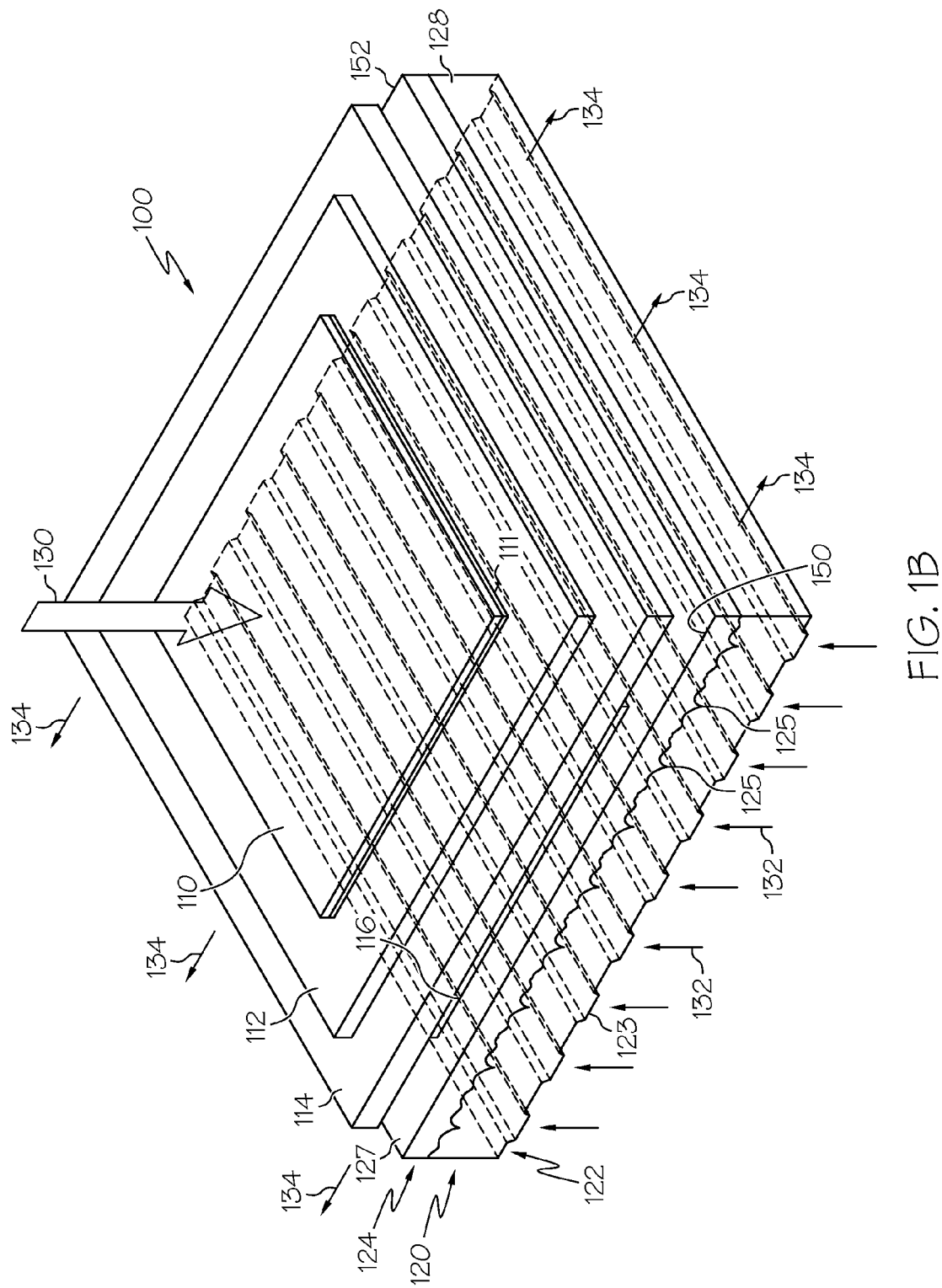

FIGS. 1A and 1B generally depict one embodiment of power module comprising a jet impingement device coupled to a heat generating device, such as a semiconductor module. The jet impingement device generally comprises a jet structure having a plurality of fluid jets operable to produce an impingement jet of fluid and a target layer. The target layer comprises a jet impingement target surface having a plurality of target structures. The target structures are shaped to maximize surface area and fluid flow at the location where the impingement jet of cooling fluid strikes the target surface to provide a reduced maximum operating temperature of the power module at a low pressure drop. Various embodiments of the jet impingement device, power module and associated methods will be described in more detail herein.

Figure 1C:
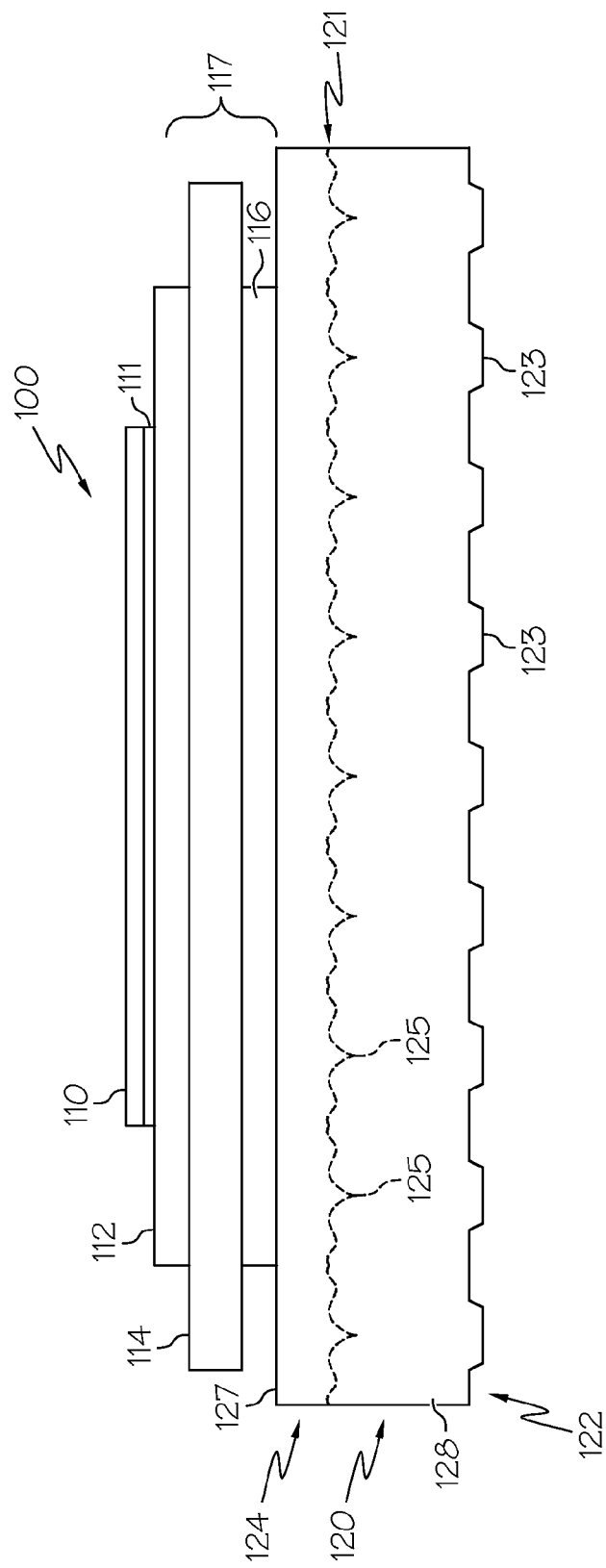

Referring now to FIGS. 1A-1C, one embodiment of a power module 100 is illustrated. FIG. 1A illustrates a perspective view of the power module 100 with a target surface 121 shown with dashed lines, FIG. 1B illustrates a perspective view with fluid flow directional arrows 132 and 134 and a jet structure 122 shown with dashed lines, and FIG. 1C illustrates a side view with the target surface 121 shown with dashed lines. The power module may be incorporated into electrical systems, such as those electrical systems used in electric and hybrid fuel-electric vehicles, for example.

The power module 100 generally comprises a jet impingement device 120 (i.e., a jet impingement heat sink) and a heat generating device 110, such as a semiconductor module, for example. The heat generating device 110 may include, without limitation, one or more IGBTs, RC-IGBTs, diodes, MOSFETs, power MOSFETs, transistors, and combinations thereof.

The jet impingement cooling device 120 generally comprises a jet structure 122 and a target layer 124 having a jet impingement target surface 121 (herein referred to as a target surface). A cooling fluid reservoir 128 is provided between the jet structure 122 and the target layer 124. The jet structure 122 comprises a plurality of fluid jets 123 and the target layer 124 comprises a target surface 121 having a topology defined by a plurality of target structures 125 positioned directly across the fluid jets 123 of the jet structure 122. The fluid jets 123 are operable to produce an impingement jet of cooling fluid 132 (FIG. 3) directed toward the target surface 121. The fluid jets 123 and the target structures 125 of the target surface 121 are arranged such that the impingement jets 132 strike the target structures 125.

The target layer 124 may be made of a thermally conductive material, such as aluminum or copper, for example, and further comprise a heat receiving surface 127. The heat generating device 110 may be thermally coupled to the jet impingement cooling device 120 directly with a bonding material, such as solder, for example. In the embodiment illustrated in FIGS. 1A-1C, the heat generating device 110 is coupled to the jet impingement cooling device 120 indirectly by a coupling structure 117 (FIG. 1C). The coupling structure 117 may be an integral component of the heat generating device 110 or the jet impingement device 120, or it may be a separate component. As illustrated in FIG. 1C, the heat generating device 110 may be bonded to a first conductive layer 112 via a bond layer 111 comprising a bonding material (e.g., nano-silver or solder). A ceramic layer 114 may be coupled to the first conductive layer 112 and a second conductive layer 116. In one embodiment, the ceramic layer 114 may be made of an aluminum nitride material. The first and second conductive layers 112, 116 may be made of aluminum, and along with the ceramic layer 114, may form a direct bonded aluminum substrate. The first and second conductive layers 112, 116 may also be made of other thermally conductive materials, such as copper (e.g., to form a direct bonded copper substrate). In the illustrated embodiment, the second thermally conductive layer 116 is thermally coupled to the heat receiving surface 127 of the target layer 124 (e.g., by use of a mechanical bond such as a braze joint). In one embodiment, the second thermally conductive layer 116 is integral with the target layer 124.

Referring specifically to FIG. 1B, the jet structure 122 comprises a plurality of fluid jets 123 formed as longitudinally extending slot jets that extend from a first end 150 to a second end 152 of the jet impingement cooling device 120. Each slot jet 123 is operable to produce a jet of cooling fluid that impinges the target surface 121 in a direction indicated by arrows 132, as described in more detail below. The impingement jets of cooing fluid produced by the slot jets 123 also extend longitudinally. In the illustrated embodiment, the continuous slot jets 123 produce a continuous, uninterrupted impingement jet of cooling fluid extending from the first edge 150 to the second edge 152 of the jet impingement cooling device 120. In another embodiment, each fluid jet 123 may be comprised of a plurality of slot jet segments such that the fluid jet 123 produces a discontinuous impingement jet of cooling fluid from the first edge 150 to the second edge 152 of the jet impingement cooling device 120. Although the illustrated embodiment comprises nine fluid jets 123 (and nine corresponding target structures 125), it should be understood that any number of fluid jets (and corresponding target structures 125) may be utilized. As described in more detail below, the cooling fluid enters the cooling fluid reservoir 128 via the fluid jets 123 and exits the jet impingement cooling device through two sides normal to the fluid jets 123 via output orifices (not shown) as indicated by arrows 134.

Referring now to FIGS. 2A and 2B, the target surface 121 and associated target structures 125 of the target layer 124 will now be described. FIG. 2A illustrates one embodiment of a target layer 124 while FIG. 2B illustrates a close-up view of an edge of a single target structure 125. The target layer 124 illustrated in FIG. 2A comprises a jet impingement target surface 121 that may be configured to provide for enhanced fluid flow for the cooling fluid that impinges the target surface 121. As described in more detail below, the surface topology of the target surface 121 may be designed using optimization methods.

The topology of the target surface 121 illustrated in FIG. 2A is defined by a plurality of adjacent longitudinally extending target structures 125 that extend from a first end to a second end of the target layer 124. Referring to both FIGS. 2A and 2B, the target structure 125 of the illustrated embodiment comprises a wave-fin topology that is characterized by a central fin peak 126 positioned between two inferior peaks 127A and 127B that end in a depression 128A and 128B, respectively. Adjacent target structures 125 meet at depressions 128A and 128B. Therefore, the illustrated target structures 125 provide for a wavy-shaped target surface 121 of the target layer 124. The wavy or rippling configuration provides for an increased surface area of the target surface 121 in which heat flux (arrow 130 in FIG. 1B) may be transferred from the target layer 124 to the cooling fluid, thereby increasing heat transfer efficiency. The wavy or rippling configuration may also provide for a relatively low pressure drop within the jet impingement cooling device.

Figure 3:
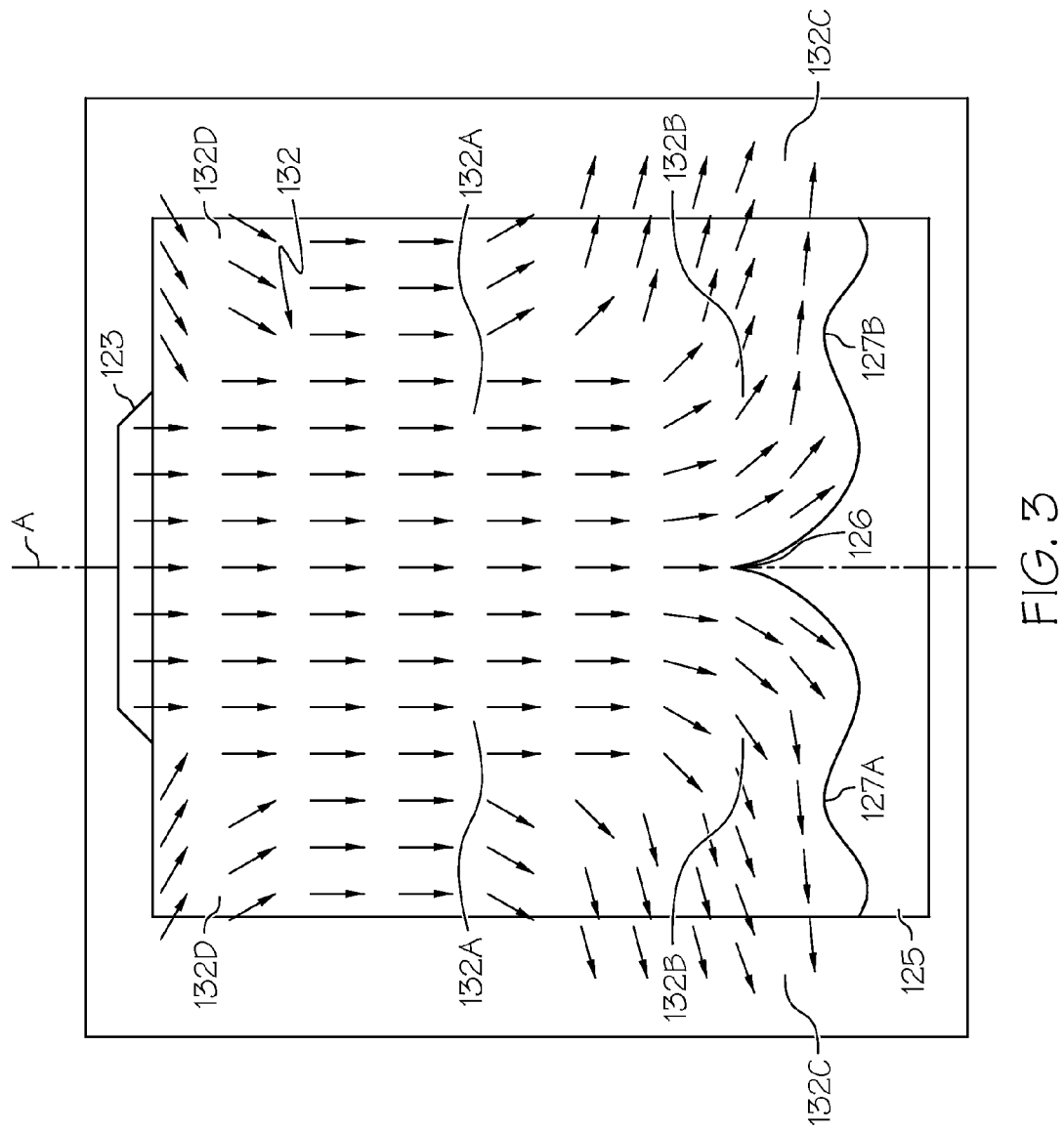
FIG. 3 depicts a schematic illustration of a slot jet fluid jet, a cooling fluid flow, and a target structure according to one or more embodiments shown and described herein.

Referring now to FIG. 3 as well as FIG. 1B, the target structures 125 are positioned directly opposite from the fluid jets 123 of the jet structure 122. Referring specifically to FIG. 3, a fluid jet 123 configured as a slot jet, an impingement jet of cooling fluid 132, and a target structure 125 are illustrated. The target structure 125 and fluid jet 123 are configured and arranged such that the fin peak 126 is aligned with a centerline A of the impingement jet of cooling fluid 132. In this manner, a central portion of the impingement jet of cooling fluid 132 impinges the fin peak 126, thereby enabling an efficient cooling fluid flow over the target surface 121.

More specifically, a central portion of the impingement jet of cooling fluid 132A is directed from the fluid jet 123 toward the fin peak 126. After striking the fin peak 126, the cooling fluid 132B is routed over the inferior peaks 127A and 127B before flowing over adjacent target structures 125 (illustrated as 132C). Cooling fluid may also recirculate back toward the fluid jet 123 and central portion of the cooling fluid flow as illustrated by 132D. The wavy configuration of the target structure 125 as well as the distance of the fluid jet 123 to the target surface 121 may be selected to provide optimum thermal transfer between the cooling fluid and the target layer 124. The fin peak 126 and inferior peaks 127A and 128B provide for an increased surface area that increases the thermal transfer. The wavy-fin topology of the target structure 125 of the embodiments described herein provides for a jet impingement cooling device that lowers a maximum operating temperature of a device to a temperature that is lower than a maximum operating temperature for a jet impingement heat sink having a flat target surface at an equal pressure drop for the same inlet velocity of the impingement jets of cooling fluid. Additionally, the inlet velocity of individual fluid jets may be varied to provide for a uniform temperature distribution across the target layer.

Figure 4A:
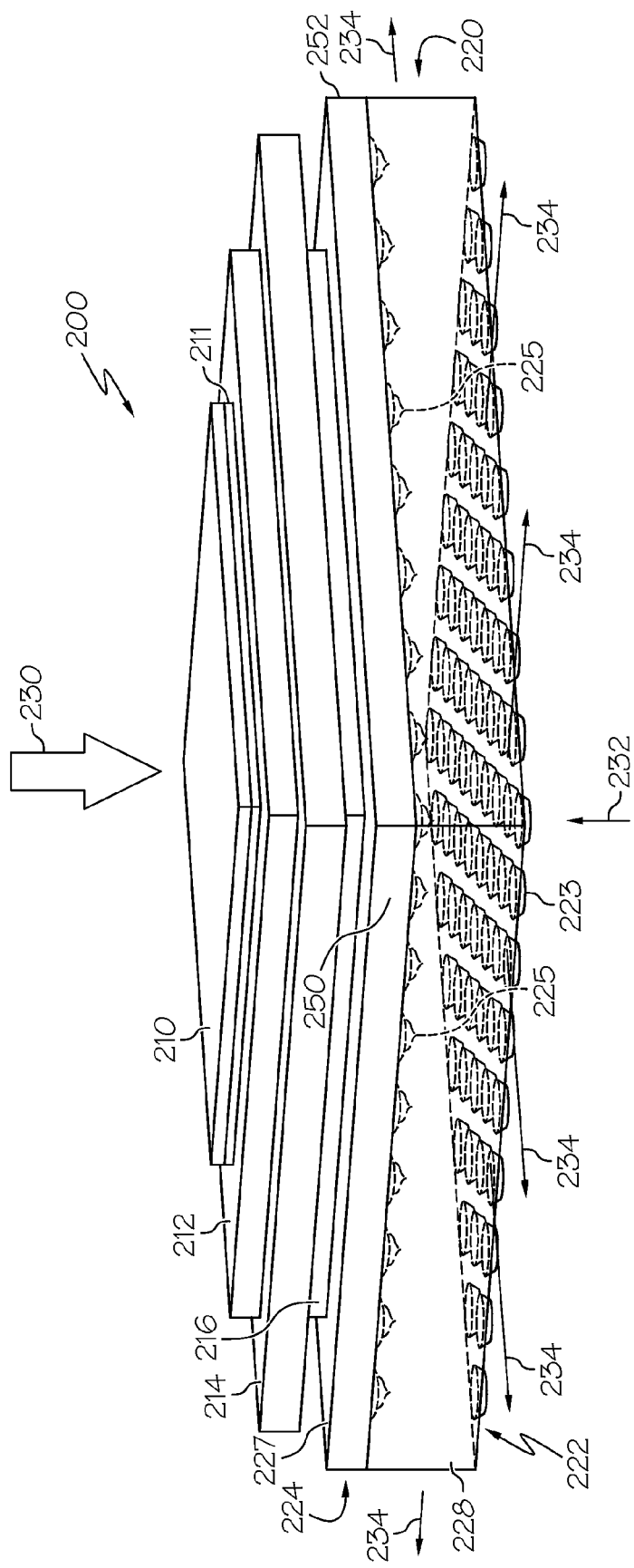
FIGS. 4A-4C depict a schematic illustration of a power module comprising a jet impingement cooling device according to one or more embodiments shown and described herein.

Another embodiment of a power module 200 comprising a jet impingement cooling device 220 is illustrated in FIGS. 4A-5B. FIG. 4A illustrates a perspective view of a power module 200 with an array of fluid jets 223 configured as nozzle jets (shown with dashed lines), FIG. 4B is a side view of the power module with a plurality of target structures 225 (shown with dashed lines), and FIG. 4C is a perspective view illustrating both the fluid jets 223 and circular target structures 225 with dashed lines. Referring first to FIG. 4B, a heat generating device 210 may be bonded to the jet impingement cooling device 220 in similar configurations as described above. The heat generating device 210 may be bonded directly to a heat receiving surface 227 directly. Or, in another embodiment illustrated in FIG. 4B, the heat generating device 210 may be coupled to the jet impingement cooling device by a coupling structure 217. The coupling structure 217 may also be an integral component of the jet impingement cooling device 220 or heat generating device 210, as described above.

As described above, the heat generating device 210 may be bonded to a first conductive layer 212 via a bond layer 211 comprising a bonding material (e.g., nano-silver or solder). A ceramic layer 214 may be coupled to the first conductive layer 212 and a second conductive layer 216. In one embodiment, the ceramic layer 214 may comprise an aluminum nitride material or other similar ceramic materials. The first and second conductive layers 212, 216 may be made of aluminum, and along with the ceramic layer 214, may form a direct bonded aluminum substrate. The first and second conductive layers 212, 216 may also be made of other thermally conductive materials, such as copper (e.g., to form a direct bonded copper substrate). In the illustrated embodiment, the second thermally conductive layer 216 is thermally coupled to the heat receiving surface 227 of the target layer 224 (e.g., by use of a mechanical bond such as a braze joint). In one embodiment, the second thermally conductive layer 216 is integral with the target layer 224.

The jet impingement cooling device 220 generally comprises a jet structure 222 and a target layer 224 having a jet impingement target surface 221. A cooling fluid reservoir 228 is provided between the jet structure 222 and the target layer 224. The jet structure 222 comprises a plurality of fluid jets 223, and the target layer 224 comprises an optimized topology defined by a plurality of target structures 225 positioned directly across the fluid jets 223 of the jet structure 222. The fluid jets 223 are operable to produce an impingement jet directed toward the target surface 221. The fluid jets 223 and the target structures 225 of the target surface 221 are arranged such that the impingement jet of cooling fluid strikes the target structures 225.

Figure 4B:
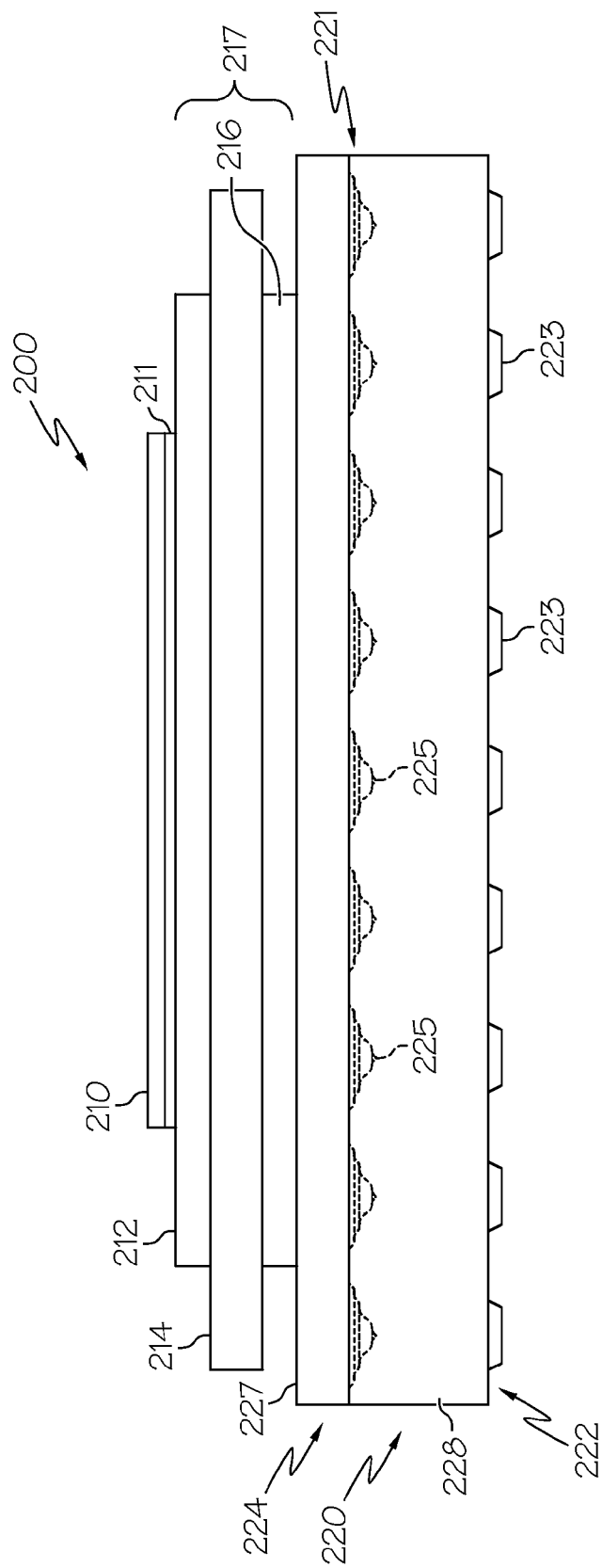
Figure 4C:
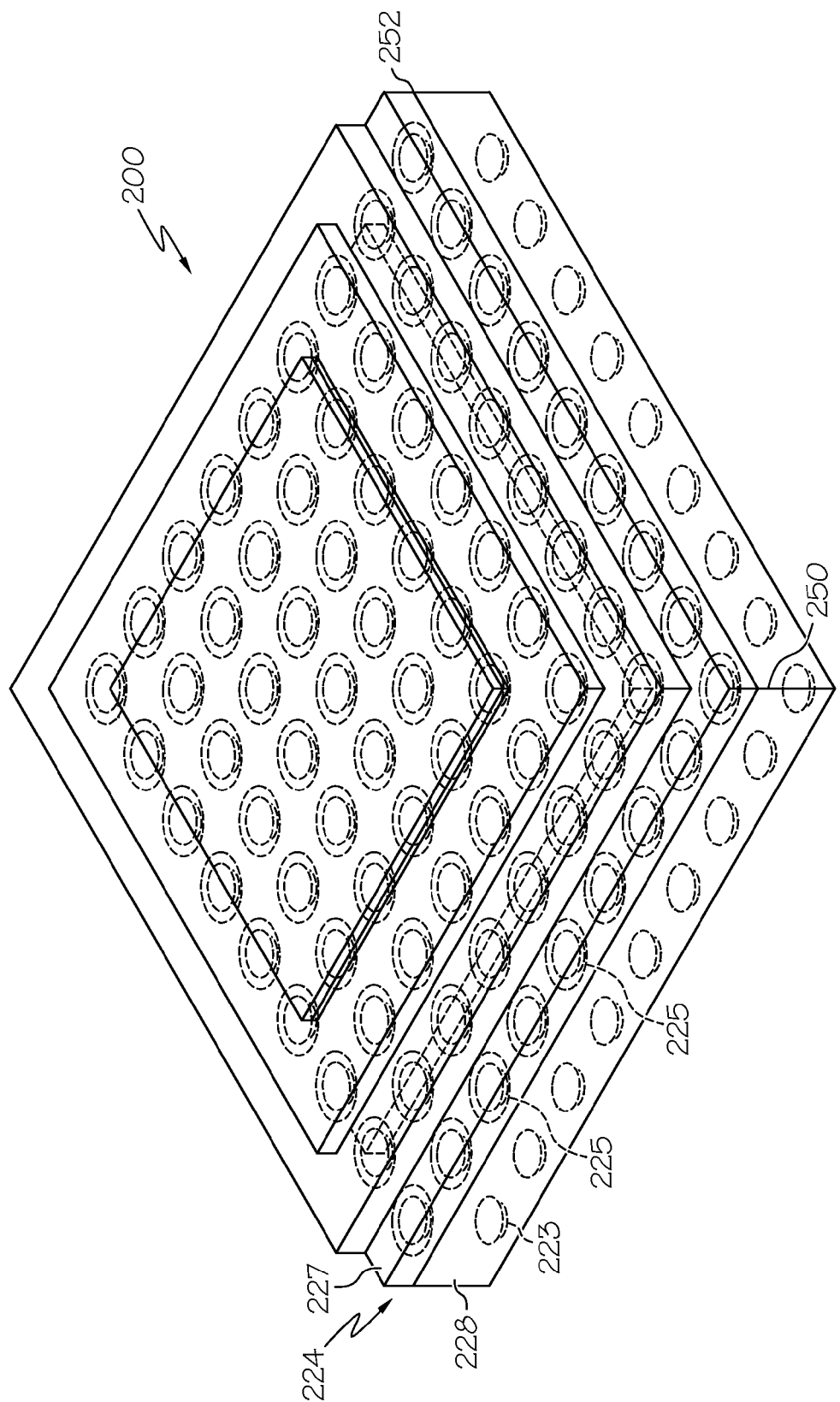

As illustrated in FIGS. 4A-4C, the jet structure 222 comprises an array of fluid jets 223 that are configured as circular nozzle jets. Although the fluid jets 223 are evenly spaced, the fluid jets 223 may be unevenly spaced within the array depending on the heat flux 230 distribution. Each nozzle jet 223 is operable to produce an impingement jet of cooling fluid that impinges the target surface 221 in a direction indicated by arrow 232. The impingement jets of cooling fluid produced by the nozzle jets 223 comprise a circular cross section and locally impinge the target surface 221. Although the illustrated embodiment comprises a nine-by-nine array of nozzle jets 223 (and a corresponding nine-by-nine array of target structures 225), it should be understood that any number of nozzle jets 223 (and corresponding target structures 225) may be utilized. The cooling fluid enters the cooling fluid reservoir 228 via the nozzle jets 223 and exits the jet impingement cooling device 220 through one, some, or all sides of the jet impingement cooling device via output orifices (not shown) as indicated by arrows 234.

Referring now to FIGS. 5A and 5B, the target surface 221 and associated target structures 225 of the target layer 224 will now be described. FIG. 5A illustrates one embodiment of a target layer 224 having an array of circular target structures 225, while FIG. 5B illustrates a close-up view of a single circular target structure 225.

The topology of the target surface 221 illustrated in FIG. 5A is defined by an array of equally spaced target structures 225. Referring to both FIGS. 2A and 2B, the target structures 225 of the illustrated embodiment comprise a ring-shaped projection having a fin peak that is formed as a conical peak 240 that rises out of a center of an outer ring shaped projection or portion 246. The conical peak 240 comprises a tip 241 that rises from a wider base 242. The base 242 is positioned within a depression 244 that is defined by the outer ring projection 246. The conical peak 240 has a higher elevation than the outer ring projection 246.

The target structures 225 have a wavy-fin topology in cross section that is characterized by the central conical peak 240 and outer ring projection 246. Therefore, the illustrated target structures 225 provide for a wavy-shaped target surface 221 of the target layer 224. As described above, the wavy or rippling configuration provides for an increased surface area of the target surface 221 in which heat flux (arrow 230 in FIG. 4A) may be transferred from the target layer 224 to the cooling fluid, thereby increasing heat transfer efficiency. The wavy or rippling configuration may also provide for a relatively low pressure drop within the jet impingement cooling device.

Referring now to FIG. 4C, the target structures 225 are positioned directly across from the nozzle jets 223 of the jet structure 222. More specifically, the target structures 225 and the nozzle jets 223 are arranged such that the conical peak 240 (i.e., fin peak) is coaxially aligned with a centerline of the circular impingement jet of cooling fluid. The wavy fin cross-sectional profile of the target structures 225 illustrated in FIGS. 4A-5B is similar to the wavy fin cross-sectional profile of the target structures 125 illustrated in FIGS. 1A-3. As described above with reference to FIG. 3, the impingement jet of cooling fluid strikes the conical peak 240 and then flows toward the depression 244 and over the outer ring projection 246. The conical peak 240 and rippling feature provided by the outer ring projection 246 provide for increased surface area of the target surface 221 and therefore increases thermal transfer between the target surface 221 and the cooling fluid.

The target surface topographies described above may be determined by an optimization procedure that may begin with designing a small-scale, individual target structure topology. Once this small-scale topology is determined, it may be extended to a large-scale topology that will make up the target surface. The optimization procedure for designing the small-scale topology may include initialization of a continuum design domain (e.g., a 2-D or 3-D optimization using continuum elements) that includes defining specification of loads, boundary conditions and design variables. A finite element analysis may be performed to solve the continuum design domain for multiple physical processes, including, but not limited to, fluid flow, heat transfer, stress values, and structural parameters. After the finite element analysis is performed, a sensitivity analysis may be performed (with respect to the design variables above) to update the domain. A family of optimal concepts may be solved based on ranges of input parameters. Selected concept structures may then be further refined into actual physical structures. A final computational analysis with exact numerical design values may then be performed on the refined designs using a computational procedure. A multi-scale synthesis procedure may be utilized to work up from the small-scale surface features to the larger target surface topology for implementation of a final jet impingement cooling structure. The shape and size of the features that define the target surface topology may change depending on the input variables (e.g., fluid inlet velocity).

Figure 6:
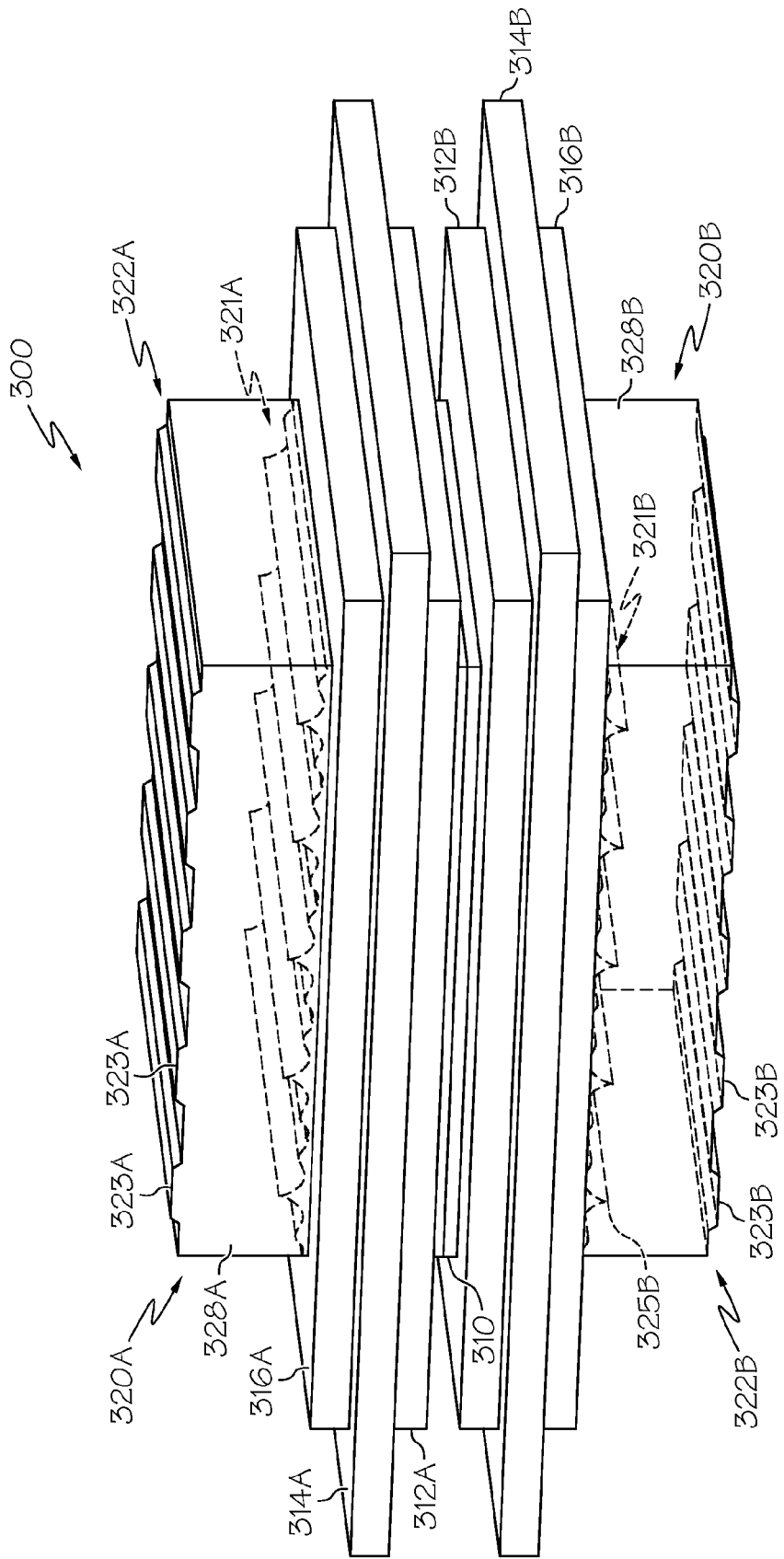
FIG. 6 depicts a schematic illustration of a power module having a heat generating device coupled to two jet impingement cooling devices according to one or more embodiments shown and described herein.

Referring now to FIG. 6, a power module 300 having two jet impingement cooling devices 320A and 320B coupled to a heat generating device 310 is illustrated. The two jet impingement cooling devices 320A and 320B provide cooling to the heat generating device 310 on two sides. The jet impingement cooling devices 320A and 320B may comprise a first thermally conductive layer 312A, 312B, a ceramic layer 314A, 314B and a second thermally conductive layer 316A, 316B. The jet impingement cooling devices 320A and 320B may also comprise a target surface 321A, 321B, cooling fluid reservoir 328A, 328B, and jet structure 322A, 322B. Although the embodiment illustrated in FIG. 6 is a double-sided slot jet style jet impingement cooling device, it should be understood that other double sided jet styles and target surface configurations are also possible, such as the nozzle jet and circular target structures described above with reference to FIGS. 4A-5B.

As an example and not a limitation, a double-sided slot jet impingement cooling device with a target surface as described above was coupled to a heat generating device as illustrated in FIG. 6. The double-sided slot jet impingement device was simulated and compared to the simulation of a double-sided slot jet impingement cooling device having a flat target surface coupled to a heat generating device. The input velocity of the cooling fluid provided by the slot jets of both devices were substantially similar, and the heat flux generated by each heat generating device were also substantially similar. The device having the target surface operated at a maximum operating temperature of 134° C. with a pressure drop of 3.4 kPa, while the device having the flat target surface operated at a maximum operating temperature of 147° C. with a pressure drop of 3.4 kPa. Therefore, the target surface provided a 13° C. lower maximum operating temperature at a similar pressure drop.

It should now be understood that the power modules, jet impingement cooling devices and methods described herein may be used to remove heat flux radiated from a heat generating device, such as a semiconductor module. By directing impingement jets of cooling fluid toward target structures of a jet impingement target surface, a maximum operating temperature of a power module may be reduced. The target structures are aligned with the impingement jets of cooling fluid such that the cooling fluid directly impinges a fin peak of the target structures and flows over the increased surface area, thereby increasing thermal transfer between the target surface and the cooling fluid.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A jet impingement cooling device comprising:
a jet structure comprising at least one fluid jet for producing an impingement jet of cooling fluid; and
a target layer comprising a heat receiving surface configured to be coupled to a heat generating device, and a jet impingement target surface, the jet impingement target surface further comprising at least one target structure comprising a wavy-fin topology having a fin peak and two inferior peaks adjacent the fin peak, wherein the fluid jet and the target structure are arranged such that the fin peak of the target structure is aligned with a centerline of the impingement jet of cooling fluid during operation of the jet impingement cooling device.

2. The jet impingement cooling device as claimed in claim 1 wherein:
the jet impingement cooling device further comprises a cooling fluid reservoir positioned between the jet structure and the jet impingement target surface; and
the cooling fluid reservoir comprises an outlet that provides a cooling fluid exit flow.

3. The jet impingement cooling device as claimed in claim 1 wherein the wavy-fin topology of the target structure is such that the jet impingement target surface has a maximum operating temperature that is less than a maximum operating temperature of a flat jet impingement target surface when coupled to the heat generating device.

4. The jet impingement cooling device as claimed in claim 1 wherein:
the fluid jet is a continuous slot jet extending from a first end of the jet structure to a second end of the jet structure; and
the target structure extends from a first end of the jet impingement target surface to a second end of the jet impingement target surface.

5. The jet impingement cooling device as claimed in claim 1 wherein:
the fluid jet is a plurality of slot jet segments arranged along an axis extending from a first end of the jet structure to a second end of the jet structure;
the target structure comprises two inferior peaks adjacent the fin peak; and
the target structure extends from a first end of the jet impingement target surface to a second end of the jet impingement target surface.

6. The jet impingement cooling device as claimed in claim 1 wherein:
the fluid jet is a nozzle jet;
the impingement jet of cooling fluid produced by the nozzle jet comprises a circular cross section; and
the target structure comprises a ring shaped projection having an outer ring portion and a conical peak projecting from a center of the outer ring portion, the conical peak defining the fin peak.

7. The jet impingement cooling device as claimed in claim 6 wherein the jet impingement target surface comprises an array of target structures aligned with a corresponding array of nozzle jets.

8. A power module comprising:
   a semiconductor module; and
   a jet impingement cooling device comprising:
      a jet structure comprising at least one fluid jet for producing an impingement jet of cooling fluid;
      a target layer further comprising:
         a heat receiving surface coupled to a first surface of the semiconductor module; and
         a jet impingement target surface, the jet impingement target surface comprising at least one target structure further comprising a wavy-fin topology having a fin peak and two inferior peaks adjacent the fin peak, wherein the fluid jet and the target structure are arranged such that the fin peak of the target structure is aligned with a centerline of the impingement jet of cooling fluid during operation of the jet impingement cooling device; and
      a cooling fluid reservoir positioned between the jet structure and the jet impingement target surface, wherein the cooling fluid reservoir receives cooling fluid from the fluid jet and comprises an outlet for providing a cooling fluid exit flow.

9. The power module as claimed in claim 8 wherein the semiconductor module is coupled to the heat receiving surface via a coupling structure comprising:
   a first thermally conductive layer;
   a bond layer configured to couple the semiconductor module to the first thermally conductive layer;
   a ceramic layer coupled to the first thermally conductive layer; and
   a second thermally conductive layer coupled to the ceramic layer and the heat receiving surface.

10. The power module as claimed in claim 8 wherein the semiconductor module comprises one or more of the following: an IGBT, a diode, a power MOSFET, and a RC-IGBT.

11. The power module as claimed in claim 8 wherein the wavy-fin topology of the target structure is such that the jet impingement target surface provides a maximum operating temperature that is less than a maximum operating temperature provided by a flat jet impingement target surface when coupled to the semiconductor module.

12. The power module as claimed in claim 8 wherein:
   the fluid jet is a continuous slot jet extending from a first end of the jet structure to a second end of the jet structure; and
   the target structure extends from a first end of the jet impingement target surface to a second end of the jet impingement target surface.

13. The power module as claimed in claim 8 wherein:
   the fluid jet is a plurality of slot jet segments arranged along an axis extending from a first end of the jet structure to a second end of the jet structure;
   the target structure comprises two inferior peaks adjacent the fin peak; and
   the target structure extends from a first end of the jet impingement target surface to a second end of the jet impingement target surface.

14. The power module as claimed in claim 8 wherein:
   the fluid jet is a nozzle jet;
   the impingement jet of cooling fluid produced by the nozzle jet comprises a circular cross section; and
   the target structure comprises a ring shaped projection having an outer ring portion and a conical peak projecting from a center of the outer ring portion, the conical peak defining the fin peak.

15. The power module as claimed in claim 14 wherein the jet impingement target surface comprises an array of target structures aligned with a corresponding array of nozzle jets.

16. The power module as claimed in claim 8 wherein the power module further comprises a second jet impingement cooling device coupled to a second side of the semiconductor module.

17. A method of cooling a heat generating device comprising:
   providing a target layer comprising a heat receiving surface coupled to the heat generating device, and a jet impingement target surface, wherein the jet impingement target surface comprises an array of target structures, each target structure comprising a wavy-fin topology having a fin peak and two inferior peaks adjacent the fin peak;
   providing an array of fluid jets; and
   directing impingement jets of cooling fluid from the array of fluid jets toward the array of target structures such that each impingement jet of cooling fluid directly impinges the fin peak of each target structure, wherein heat generated by the heat generating device is transferred to the cooling fluid to create a substantially uniform temperature distribution across the jet impingement target surface.

18. The method as claimed in claim 17 wherein the wavy-fin topology of the target structure is such that the jet impingement target surface has a maximum operating temperature that is less than a maximum operating temperature of a flat jet impingement target surface when coupled to the heat generating device.

19. The method as claimed in claim 17 wherein:
   the fluid jet is a slot jet extending from a first end of a jet structure to a second end of the jet structure; and
   the target structure extends from a first end of the jet impingement target surface to a second end of the jet impingement target surface.

20. The method as claimed in claim 17 wherein:
   the fluid jet is a nozzle jet;
   the impingement jets of cooling fluid produced by the nozzle jet comprise a circular cross section; and
   the target structure comprises a ring shaped projection having an outer ring portion and a conical peak, the conical peak projecting from a center of the outer ring portion and defining the fin peak.

* * * * *